(12) United States Patent
Hong

(10) Patent No.: US 9,362,531 B2
(45) Date of Patent: Jun. 7, 2016

(54) ORGANIC LIGHT EMITTING DISPLAY DEVICE AND MANUFACTURING METHOD THEREOF

(71) Applicant: Samsung Display Co., Ltd., Yongin, Gyeonggi-Do (KR)

(72) Inventor: Sang-Min Hong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 47 days.

(21) Appl. No.: 14/209,802

(22) Filed: Mar. 13, 2014

(65) Prior Publication Data

US 2015/0102295 A1   Apr. 16, 2015

(30) Foreign Application Priority Data

Oct. 14, 2013   (KR) .......................... 10-2013-0122195

(51) Int. Cl.
*H01L 27/32* (2006.01)
*H01L 51/52* (2006.01)
*H01L 51/56* (2006.01)

(52) U.S. Cl.
CPC .......... *H01L 51/529* (2013.01); *H01L 51/5246* (2013.01); *H01L 51/525* (2013.01)

(58) Field of Classification Search
CPC ............... H01L 51/524–51/525; H01L 51/529
See application file for complete search history.

(56) References Cited

U.S. PATENT DOCUMENTS

| 2006/0065903 | A1* | 3/2006 | Sakurai ............... H01L 27/3276 257/82 |
| 2006/0091397 | A1 | 5/2006 | Akimoto et al. |
| 2007/0045616 | A1* | 3/2007 | Tokuda ................. H01L 51/529 257/40 |
| 2007/0170850 | A1 | 7/2007 | Choi et al. |
| 2007/0176171 | A1 | 8/2007 | Kim et al. |
| 2009/0126403 | A1 | 5/2009 | Abramov et al. |
| 2011/0134094 | A1 | 6/2011 | Nathan et al. |
| 2011/0221720 | A1 | 9/2011 | Kuo et al. |
| 2013/0077917 | A1 | 3/2013 | Lassalas et al. |
| 2014/0159017 | A1* | 6/2014 | Ikeda .................... H01L 51/529 257/40 |

FOREIGN PATENT DOCUMENTS

| JP | 2006-156369 A | 6/2006 |
| KR | 10-0635514 B1 | 10/2006 |
| KR | 10-0688789 B1 | 2/2007 |
| KR | 10-0714000 B1 | 4/2007 |

* cited by examiner

*Primary Examiner* — Raj R Gupta
(74) *Attorney, Agent, or Firm* — Knobbe, Martens, Olson & Bear, LLP

(57) ABSTRACT

An organic light emitting display device and manufacturing method thereof are disclosed. One inventive aspect includes a first substrate, a second substrate, a pixel unit, a circuit unit, a sealing member and a radiation unit. The pixel unit is formed on the first substrate and comprises an organic light emitting device and a thin-film transistor (TFT). The radiation unit includes radiation fins formed in the sealing member and a radiation layer contacting first ends of the radiation fins.

20 Claims, 4 Drawing Sheets

ORGANIC LIGHT EMITTING DISPLAY DEVICE AND MANUFACTURING METHOD THEREOF

RELATED APPLICATIONS

This application claims the benefit of Korean Patent Application No. 10-2013-0122195, filed on Oct. 14, 2013, in the Korean Intellectual Property Office, the disclosure of which is incorporated herein in its entirety by reference.

BACKGROUND

1. Field

The disclosed technology relate to organic light emitting display devices with reduced dead space and manufacturing methods thereof with a high power laser beam.

2. Description of the Related Technology

An organic light emitting display device includes an organic light emitting device including a hole injection electrode, an electron injection electrode, and an emission layer formed therebetween. The organic light emitting display device is a self-luminescent display device which emits light as excitons. The excitons are generated as holes, which are injected by the hole injection electrode, and electrons, which are injected by the electron injection electrode, are combined with each other at the emission layer and transit from the excited state to the ground state.

As a self-luminescent display, an organic light emitting display device requires no separate light source. In addition, it can be driven by a low voltage power source, it can also be configured to be light-weight and thin and it exhibits excellent characteristics, such as a wide viewing angle, high contrast, and fast response speed. Therefore, the organic light emitting display device is widely regarded as the next-generation display device. However, an organic light emitting device can prematurely degraded by reaction with external moisture or oxygen. Therefore, it is necessary to prevent permeation of external moisture or oxygen into an organic light emitting device.

SUMMARY OF CERTAIN INVENTIVE ASPECTS

One or more embodiments of the disclosed technology include organic light emitting display devices and manufacturing methods thereof.

Additional aspects will be set forth in part in the description which follows and, in part, will be apparent from the description, or may be learned by practice of the presented embodiments.

According to one or more embodiments of the disclosed technology, an organic light emitting display device includes a first substrate and a second substrate facing each other; a pixel unit, which is formed on the first substrate and includes an organic light emitting device and a thin-film transistor (TFT); a circuit unit, which is formed on the first substrate and is arranged outside the pixel unit; a sealing member, which partially overlaps the circuit unit and adheres the first substrate and the second substrate to each other; and a radiation unit, which includes a plurality of radiation fins formed in the sealing member and a radiation layer contacting first ends of the radiation fins.

The first ends of the radiation fins extend toward the first substrate, and the radiation layer extends to outside of the first substrate.

The radiation fins have a pillar-like shape and are apart from one another.

The TFT includes an active layer; a gate electrode, which is formed on the active layer via a gate insulation layer; and a source electrode and a drain electrode, which penetrate through the gate insulation layer and an interlayer insulation layer formed on the gate insulation layer and contact the active layer, and the radiation layer is formed on the gate insulation layer and is formed of a same material as the gate electrode.

The interlayer insulation layer is formed on the radiation layer, and the radiation fins penetrate through the interlayer insulation layer and contact the radiation layer.

A wiring unit is formed on the interlayer insulation layer in the pixel unit, and the wiring unit includes contact holes via which some of the radiation fins extend.

Insulation layers are formed on inner side surfaces of the contact holes.

The organic light emitting device includes a pixel electrode contacting the drain electrode, a counter electrode arranged on the pixel electrode, and an intermediate layer interposed between the pixel electrode and the counter electrode, a pixel defining layer, which defines a region for forming the intermediate layer, is formed on the pixel electrode, and the insulation layers are formed of a same material as the pixel defining layer.

The some of the radiation fins penetrate through the pixel defining layer overlapping the sealing member.

A touch panel wiring unit is arranged on a surface of the second substrate opposite to the surface of the second substrate contacted by the sealing member, and the touch panel wiring unit is formed at a location overlapping the sealing member.

The organic light emitting display device further includes a buffer layer formed on the first substrate.

According to one or more embodiments of the disclosed technology, a method of manufacturing an organic light emitting display device, the method includes forming an active layer and a gate insulation layer covering the active layer on a first substrate; forming a radiation layer and a gate electrode on the gate insulation layer and an interlayer insulation layer covering the radiation layer and the gate electrode; forming a first wiring and a source electrode and a drain electrode, which contact the active layer, on the interlayer insulation layer and forming a passivation layer covering the source electrode and the drain electrode; forming a second wiring contacting the first wiring and a pixel electrode contacting the drain electrode; forming holes exposing the top surface of the radiation layer by patterning the first wiring and the second wiring; forming a pixel defining layer including contact holes for exposing the top surface of the radiation layer by applying insulation layers in the holes and on the pixel electrode and patterning the insulation layers; forming radiation fins in the contact holes; and adhering the first substrate and a second substrate to each other by forming a sealing member to include the radiation fins.

The insulation layers fill the holes, and the contact holes are formed by patterning the insulation layers filling the holes.

The contact holes are smaller than the holes.

The radiation fins are formed to be higher than the pixel defining layer, thus being inserted into the sealing member.

The radiation fins are formed in a vertical direction, and the radiation layer horizontally extends toward edges of the first substrate.

The pixel defining layer partially exposes the pixel electrode, and an intermediate layer and a counter electrode are formed on the exposed portion of the pixel electrode in the order stated.

A touch panel wiring unit is formed on the second substrate at a location overlapping the sealing member.

A laser beam is irradiated in a direction from the first substrate toward the second substrate to form the sealing member.

The radiation layer and the radiation fins are formed of different materials.

DETAILED DESCRIPTION OF CERTAIN INVENTIVE EMBODIMENTS

Figure 1:
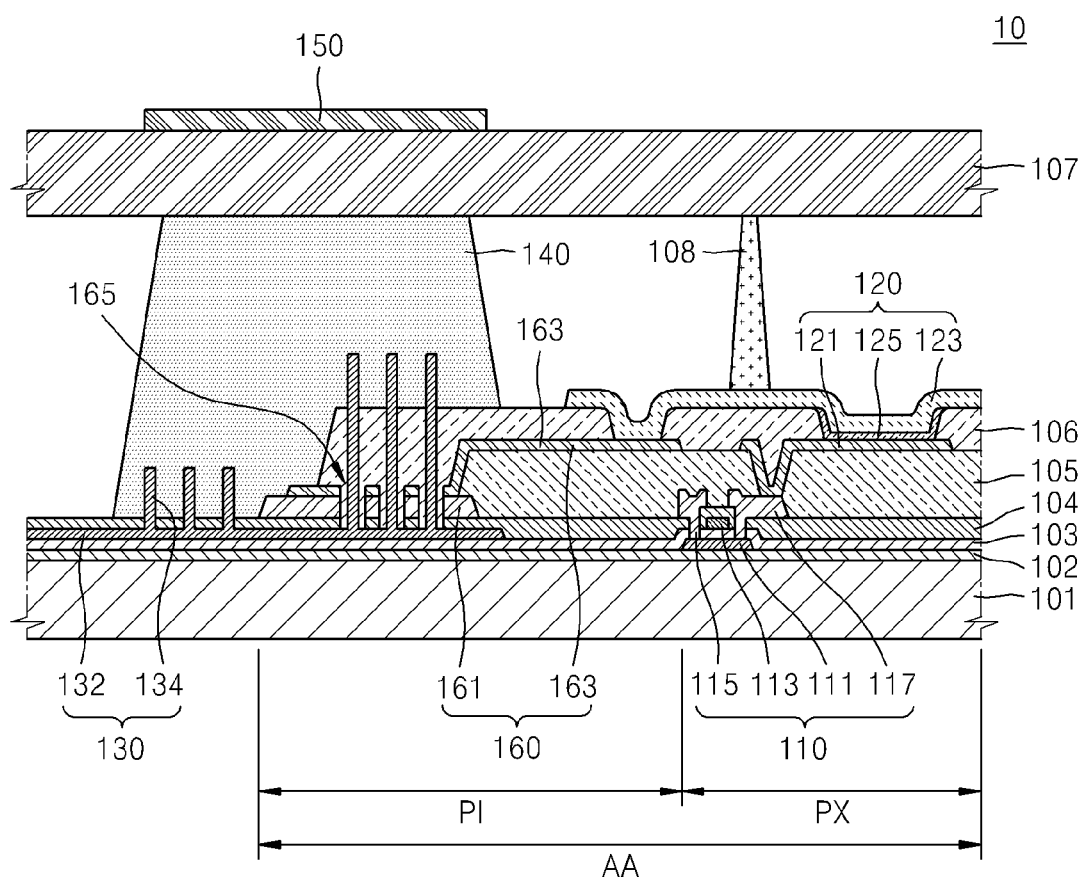
FIG. 1 is a schematic sectional view of an organic light emitting display device according to an embodiment of the disclosed technology.

Reference will now be made in detail to embodiments, examples of which are illustrated in the accompanying drawings, wherein like reference numerals refer to like elements throughout. In this regard, the present embodiments can have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

In the following description, technical terms are used only to explain a specific exemplary embodiment while not limiting the disclosed technology. The terms of a singular form can include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components can be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements can also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but can also be indirectly connected to the second element via a third element. Further, some of the elements that are not essential to the complete understanding of the disclosed technology are omitted for clarity. Also, like reference numerals refer to like elements throughout.

Hereinafter, embodiments of the invention will be described below in more detail with reference to the accompanying drawings. Those components that are the same or are in correspondence are rendered the same reference numeral regardless of the figure number, and redundant explanations are omitted.

FIG. 1 is a schematic sectional view of a organic light emitting display device 10 according to an embodiment of the disclosed technology.

Referring to FIG. 1, the organic light emitting display device 10 according to an embodiment of the disclosed technology canincludes a first substrate 101 and a second substrate 107, a pixel unit PX formed on the first substrate 101, a circuit unit PI arranged outside the pixel unit PX, a sealing member 140, and a radiation unit. The first substrate 101 and the second substrate 107 face each other. The sealing member 140 adheres the first substrate 101 and the second substrate 107 to each other. The radiation unit includes a radiation fins 134 which are formed inside the sealing member 140.

The first substrate 101 can be formed of a transparent material. In some exemplary implementations, the first substrate 101 canis formed of a transparent glass containing $SiO_2$ or a transparent plastic.

A buffer layer 102 can be formed on the first substrate 101. The buffer layer 102 is formed to completely cover the top surface of the first substrate 101. In other words, the buffer layer 102 covers both the display region AA and regions surrounding the display region AA. The buffer layer 102 prevents permeation of impurity atoms through the first substrate 101 and provides a flat surface on the first substrate 101. The buffer layer 102 can be formed of any of various materials that are suitable for the purposes.

In some exemplary implementations, the buffer layer 102 cancontains an inorganic material, such as a silicon oxide, a silicon nitride, a silicon oxynitride, an aluminum oxide, an aluminum nitride, a titanium oxide, or a titanium nitride, or an organic material, such as polyimide, polyester, or acryl. The buffer layer 102 can also be formed as a stacked structure in which a plurality of layers formed of materials as stated above are stacked. Furthermore, the buffer layer 102 is not an essential component and can be omitted as an occasion demands.

The display region AA is defined on the first substrate 101. The pixel unit PX and the circuit unit PI are formed at the display region AA.

The pixel unit PX is a region which substantially emits visible rays. The pixel unit PX can include a thin-film transistor (TFT) 110 and an organic light emitting device 120.

The TFT 110 includes an active layer 111, a gate electrode 113, a source electrode 115, and a drain electrode 117.

The active layer 111 can be formed of an inorganic semiconductor, such as amorphous silicon or polysilicon, an organic semiconductor, or an oxide semiconductor. The active layer 111 includes a source region, a drain region, and a channel region.

A gate insulation layer 103 is formed on the active layer 111. The gate insulation layer 103 can be formed to correspond to the entire first substrate 101. In other words, the gate insulation layer 103 is formed at both the display region AA and regions surrounding the display region AA. The gate insulation layer 103 is a layer for insulation between the active layer 111 and the gate electrode 113 and can be formed of an organic material or an inorganic material, such as $SiN_X$ and $SiO_2$.

The gate electrode 113 is formed at a designated region on the gate insulation layer 103. The gate electrode 113 is connected to a gate line (not shown) which applies signals for turning the TFT 110 ON/OFF.

The gate electrode 113 cancan be formed of Au, Ag, Cu, Ni, Pt, Pd, Al, or Mo and cancan be formed of an alloy, such as Al:Nd or Mo:W. However, the disclosed technology is not limited thereto, and the gate electrode 113 can be formed of any of various materials in consideration of design conditions.

An interlayer insulation layer 104 is formed on the gate electrode 113 and is a layer for insulation between the gate electrode 113 and the source electrode. The interlayer insulation layer 104 can be a layer for insulation between the gate electrode 113 and the drain electrode 117. The interlayer insulation layer 104 can be formed of an inorganic material, such as $SiN_X$ and $SiO_2$.

The source electrode 115 and the drain electrode 117 are formed on the interlayer insulation layer 104. In detail, the interlayer insulation layer 104 and the gate insulation layer 103 are formed to expose the source region and the drain region of the active layer 111. The source electrode 115 and the drain electrode 117 are formed to contact the exposed source region and the exposed drain region of the active layer 111, respectively.

Meanwhile, although FIG. 1 shows the top gate type TFT 110 which includes the active layer 111, the gate electrode 113, the source electrode 115, and the drain electrode 117 in the order stated, the disclosed technology is not limited thereto, and the gate electrode 113 can be arranged below the active layer 111.

The TFT 110 is electrically connected to the organic light emitting device 120 and drives the organic light emitting device 120. The TFT 110 is covered and protected by a passivation layer 105.

The organic light emitting device 120 can include a pixel electrode 121, a counter electrode 123, and an intermediate layer 125. The intermediate layer 125 is interposed between the pixel electrode 121 and the counter electrode 123.

The pixel electrode 121 is formed on the passivation layer 105 and is electrically connected to the drain electrode 117 via a contact hole formed in the passivation layer 105.

The pixel electrode 121 can be a reflective electrode and can include a reflective layer formed of Ag, Mg, Al, Pt, Pd, Au, Ni, Nd, Ir, Cr, or an alloy thereof and a transparent or semi-transparent electrode layer formed on the reflective layer. The transparent or semi-transparent electrode layer cancan be formed of at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 123 can be a transparent or semi-transparent electrode and can be formed as a metal thin-film having a small work function containing Li, Ca, LiF/Ca, LiF/Al, Al, Ag, Mg, or an alloy thereof. Furthermore, an auxiliary electrode layer or a bus electrode can be further from on the metal thin-film using a transparent electrode material, such as ITO, IZO, ZnO, or $In_2O_3$.

Therefore, the counter electrode 123 can transmit a light emitted by an emission layer (not shown) included in the intermediate layer 125. In other words, a light emitted by the emission layer is reflected by the pixel electrode 121 and can be emitted toward the counter electrode 123. The pixel electrode 121 can be a reflective electrode.

However, the organic light emitting display device 10 according to the present embodiment is not limited to a top emission type. The organic light emitting display device 10 can also be a bottom emission type in which a light emitted by an emission layer (not shown) is emitted toward the first substrate 101. In this case, the pixel electrode 121 can be embodied as a transparent or semi-transparent electrode layer, whereas the counter electrode 123 can be embodied as a reflective electrode. Furthermore, the organic light emitting display device 10 can be a dual emission type in which lights are emitted in both directions.

A pixel defining layer 106, which is formed of an insulation material, is formed on the pixel electrode 121. The pixel defining layer 106 can be formed of one or more organic insulation materials selected from a group consisting of polyimide, polyamide, acrylic resins, benzocyclobuthane, and phenolic resins using a method like spin coating. The pixel defining layer 106 defines a region for forming the intermediate layer 125 by exposing a designated region of the pixel electrode 121, where the intermediate layer 125 including an emission layer is arranged at the exposed region.

The emission layer included in the intermediate layer 125 can be formed of an organic monomer material or an organic polymer material. The intermediate layer 125 can not only include the emission layer, but also selectively include function layers, such as a hole transport layer (HTL), a hole injection layer (HIL), an electron transport layer (ETL), and an electron injection layer (EIL).

The circuit unit PI can include a wiring unit 160. The wiring unit 160 can include a first wiring 161 and a second wiring 163. The first wiring 161 is a power wiring and the second wiring 163 is a circuit wiring. Furthermore, the circuit unit PI can include various other circuit patterns, such as an anti-static pattern.

The first wiring 161 is formed at a portion of the circuit unit PI on the interlayer insulation layer 104. The first wiring 161 can be formed of a same material as the source electrode 115 or the drain electrode 117. Meanwhile, the passivation layer 105 is also formed at a designated region on the first wiring 161.

The second wiring 163 is formed of a same material as the pixel electrode 121 and is connected to the first wiring 161. Furthermore, the second wiring 163 can be connected to the counter electrode 123.

The second substrate 107 can be formed of a transparent material like the first substrate 101. A touch panel wiring unit 150 can be arranged on a surface opposite to the surface contacted by the sealing member 140. The touch panel wiring unit 150 is connected to a touch screen panel (not shown) arranged on the organic light emitting display device 10. The touch panel wiring unit 150 can be arranged to overlap the sealing member 140. Furthermore, a spacer 108 can be arranged between the first substrate 101 and the second substrate 107 to maintain a distance between the first substrate 101 and the second substrate 107.

The sealing member 140 is formed along the edges of the first substrate 101 and the second substrate 107. The sealing member 140 can be formed of an ultraviolet (UV) ray hardening resin or a thermally hardening resin. The sealing member 140 is arranged to partially overlap the circuit unit PI, thereby reducing dead spaces of the organic light emitting display device 10.

Meanwhile, as described below, the sealing member 140 is formed by being hardened by irradiating a laser beam thereto. Here, as described above, the sealing member 140 partially overlaps the circuit unit PI on the first substrate 101 downward and overlaps the touch panel wiring unit 150 upward. Therefore, a temperature profile of the sealing member 140 can exhibit an irregular distribution during irradiation of a laser beam. In this case, sealing effect of the sealing member 140 is deteriorated and thus external moisture or oxygen can permeate into the organic light emitting display device 10. Meanwhile, although power of an irradiation laser can be increased to prevent the problem, a laser beam with increased power can excessively raise temperature of the sealing member 140, thereby damaging the circuit unit PI which overlaps the sealing member 140.

Meanwhile, to resolve the problems as stated above, the organic light emitting display device 10 includes the radiation unit 130. In detail, the radiation unit 130 can include a plurality of radiation fins 134 formed in the sealing member 140 and a radiation layer 132. The radiation layer 132 contacts first ends of the plurality of radiation fins 134.

The radiation fins 134 are formed in the sealing member 140 and extend toward the first substrate 101. Furthermore, the radiation fins 134 are formed to be apart from one another. The radiation fins 134 can have any of various pillar-like shapes, such as a cylindrical shape and a polygonal pillar-like shape. Therefore, when area of the radiation fins 134 contacting the sealing member 140 increases, heat inside the sealing member 140 can be effectively transmitted to the radiation layer 132. The radiation fins 134 can be formed of a same material as the radiation layer 132 or a material different from the material constituting the radiation layer 132. In some exemplary implementations, the radiation fins 134 canare formed of a metal, such as molybdenum (Mo), titanium (Ti), and aluminum (Al).

The radiation layer 132 is formed on the gate insulation layer 103 and can extend to outside the first substrate 101. Therefore, heat transmitted from the radiation fins 134 can be easily radiated to outside of the organic light emitting display device 10. The radiation layer 132 can be formed of a same material as the gate electrode 113.

Meanwhile, like the sealing member 140, the radiation layer 132 can be successively formed along the edges of the first substrate 101. Therefore, to prevent short-circuit with the circuit unit PI, the interlayer insulation layer 104 can be formed on the radiation layer 132. Here, the radiation fins 134 can penetrate the interlayer insulation layer 104 and contact the radiation layer 132.

Furthermore, all or some of the radiation fins 134 can be formed to overlap the circuit unit PI. As described above, the circuit unit PI includes the wiring unit 160. Here, if the radiation fins 134 are formed in the circuit unit PI, the radiation fins 134 can penetrate through the wiring unit 160 and contact the radiation layer 132. In some exemplary implementations, the wiring unit 160 canis patterned and includes holes corresponding to locations at which the radiation fins 134 are formed.

Furthermore, to prevent short-circuit between the wiring unit 160 and the radiation fins 134, insulations layers can be formed on inner side surfaces of the holes formed in the wiring unit 160. The insulation layers can be formed by filling the holes formed in the wiring unit 160 with an insulation material. The insulation material constitutes the pixel defining layer 106 during the formation of the pixel defining layer 106 and forms contact holes 165. The contact holes 165 are smaller than the holes formed in the wiring unit 160 by patterning the insulation material filling the holes formed in the wiring unit 160. In other words, a part of the radiation fins 134 can be formed to penetrate through the pixel defining layer 106 overlapping the sealing member 140. The radiation fins 134 are formed to be higher than the pixel defining layer 106 and directly contact the sealing member 140.

The radiation unit 130 includes the radiation fins 134 and the radiation layer 132 contacting the radiation fins 134. The radiation fins 134 are inserted into the sealing member 140. Therefore, heat inside the sealing member 140 can be effectively radiated. Therefore, the sealing member 140 can be formed by using a high-power laser beam without damaging the circuit unit PI.

FIGS. 2 through 6 are sectional diagrams showing a method of manufacturing the organic light emitting display device 10 of FIG. 1 in an order. Hereinafter, the method of manufacturing the organic light emitting display device 10 according to an embodiment of the disclosed technology will be described.

Figure 2:
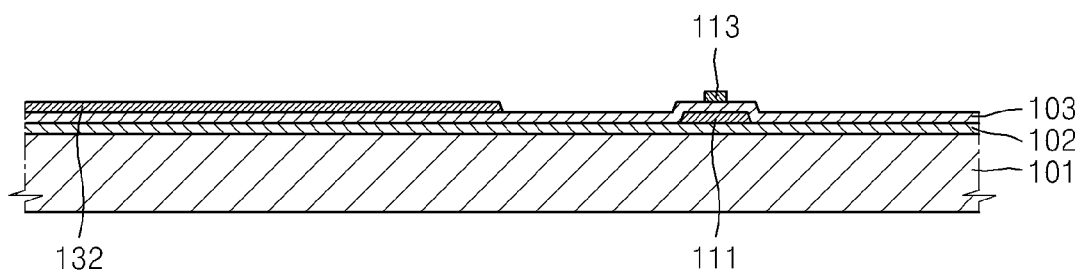
FIG. 2 is a schematic sectional view of an active layer, a gate insulation layer and a radiation layer formed on an organic light emitting display device according to an exemplary embodiment of the disclosed technology.

First, as shown in FIG. 2, the active layer 111 and the gate insulation layer 103 covering the active layer 111 are formed on the first substrate 101. The radiation layer 132 and the gate electrode 113 are formed on the gate insulation layer 103.

Meanwhile, a buffer layer (not shown) containing $SiO_2$ and/or $SiN_X$ can be further arranged on the first substrate 101 for planarity of the first substrate 101 and prevention of permeation of impurity atoms. The active layer 111 can be formed of amorphous silicon or poly silicon. Here, the poly silicon can be formed by crystallizing amorphous silicon. Amorphous silicon can be crystallized using any of various methods including rapid thermal annealing (RTA), solid phase crystallization (SPC), excimer laser annealing (ELA), metal induced crystallization (MIC), metal induced lateral crystallization (MILC), sequential lateral solidification (SLS), etc.

The gate insulation layer 103 can be formed of material containing $SiO_2$ and/or $SiN_x$.

The radiation layer 132 and the gate electrode 113 can be formed by forming layer containing one or more metals selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and patterning the layer.

Meanwhile, the gate electrode 113 is formed on the active layer 111 via the gate insulation layer 103, where the active layer 111 can be doped with an impurity by using the gate electrode 113 as a self-align mask. In other words, the active layer 111 can include a channel region overlapping the gate electrode 113, a source region and a drain region. At least one of the gate electrode 113, a source region and a drain region are arranged at both sides of the channel region respectively and are doped with impurities.

Figure 3:
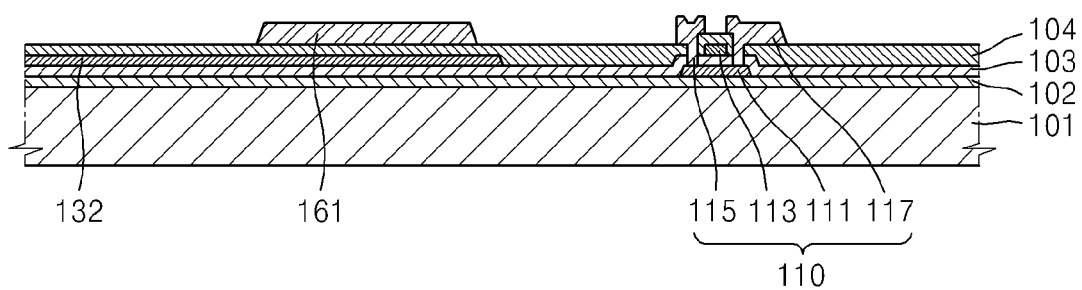
FIG. 3 is a schematic sectional view of an interlayer insulation layer, a first wiring, a source electrode and a drain electrode formed on an organic light emitting display device according to an exemplary embodiment of the disclosed technology.

Next, as shown in FIG. 3, the interlayer insulation layer 104 is formed. The first wiring 161, the source electrode 115, and the drain electrode 117 are formed on the interlayer insulation layer 104.

The first wiring 161 can be a power wiring. The first wiring 161 can be formed of a same material as the source electrode 115 or the drain electrode 117.

The source electrode 115 and the drain electrode 117 contain one or more metals selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and can contact the source region and the drain region of the active layer 111 via contact holes formed in the interlayer insulation layer 104, respectively.

Figure 4:
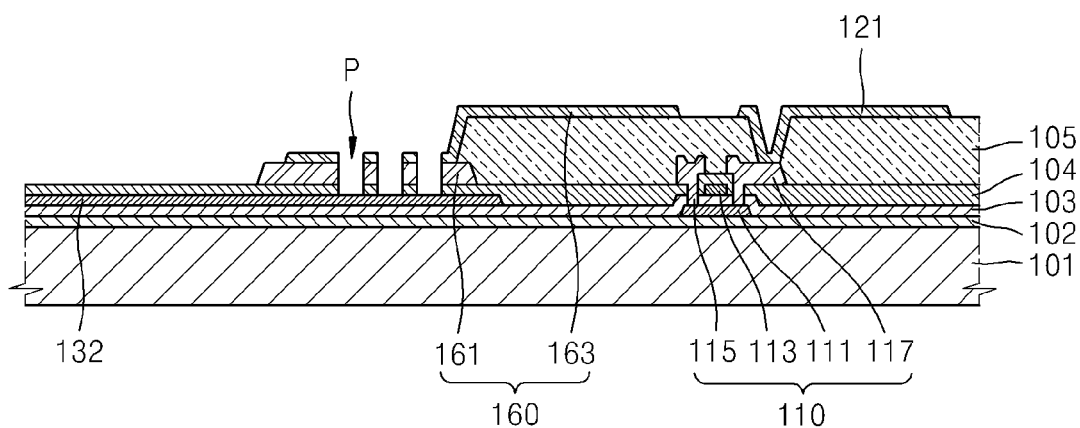
FIG. 4 is a schematic sectional view of a passivation layer formed on an organic light emitting display device according to an exemplary embodiment of the disclosed technology.

Next, as shown in FIG. 4, the passivation layer 105 covering the source electrode 115 and the drain electrode 117 are formed. The second wiring 163 contacting the first wiring 161 and the pixel electrode 121 contacting the drain electrode 117 are formed on the passivation layer 105.

The passivation layer 105 can be formed as an inorganic insulation layer and/or an organic insulation layer. The inorganic insulation layer cancan be formed of $SiO_2$, $SiN_x$, SiON, $Al_2O_3$, $TiO_2$, $Ta_2O_5$, $HfO_2$, $ZrO_2$, BST, PZT, etc., whereas the organic insulation layer cancan be formed of general multipurpose polymers (PMMA, PS), polymer derivatives containing phenolic groups, acrylic polymers, imide-based polymers, arylether-based polymers, amide-based polymers, fluorine-based polymers, p-xylene-based polymers, vinyl-alcohol-based polymers, and blends thereof. Furthermore, the passivation layer 105 can be formed as a composite stacked structure in which an inorganic insulation layer and an organic insulation layer are stacked.

The second wiring 163 and the pixel electrode 121 can be formed of a same material. In some exemplary implementations, if the pixel electrode 121 functions as an anode, the second wiring 163 and the pixel electrode 121 cancan be formed of ITO, IZO, ZnO, or $In_2O_3$, which have high work functions.

The second wiring 163 can be a circuit wiring. The second wiring 163 can be electrically connected to the first wiring 161.

The first wiring 161 and the second wiring 163 can be patterned to form holes P exposing the top surfaces of the radiation layer 132. The holes P are formed in correspondence to locations at which radiation fins (134 of FIG. 6) are to be formed. The holes P can be larger than the radiation fins (134 of FIG. 6). In some exemplary implementations, if the second wiring 163 canis formed to overlap the first wiring 161 and the radiation fins (134 of FIG. 6) are formed at locations where the second wiring 163 overlaps the first wiring 161, the second wiring 163 and the first wiring 161 canare simultaneously patterned.

Figure 5:
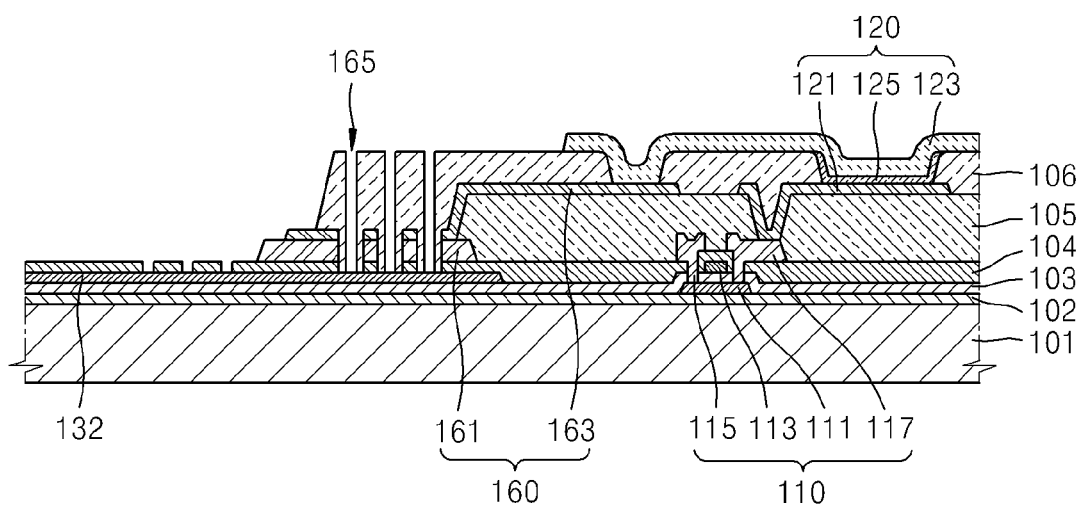
FIG. 5 is a schematic sectional view of a pixel defining layer formed on an organic light emitting display device according to an exemplary embodiment of the disclosed technology.

Next, as shown in FIG. 5, the pixel defining layer 106 is formed by applying and patterning an insulation layer. Here, the insulation layer also fills the holes P exposing the top surface of the radiation layer 132. The applied insulation layer is patterned, thereby forming the contact holes 165 exposing the top surface of the radiation layer 132 and the pixel defining layer 106 exposing a designated region of the pixel electrode 121.

The contact holes 165 are formed at locations at which radiation fins (134 of FIG. 6) are formed. The contact holes 165 are smaller than the holes (P of FIG. 4). Therefore, even if the radiation fins (134 of FIG. 6) are formed in the contact holes 165, the radiation fins (134 of FIG. 6) and the wiring unit 160 can be insulated from each other.

Meanwhile, if the radiation fins (134 of FIG. 6) is formed at locations not overlapping the wiring unit 160, only the interlayer insulation layer 104 at the locations at which the radiation fins (134 of FIG. 6) are to be formed can be patterned.

Meanwhile, the intermediate layer 125 and the counter electrode 123 are formed on the pixel electrode 121, which is partially exposed by the pixel defining layer 106, in the order stated.

The intermediate layer 125 includes an emission layer (not shown), whern? the emission layer can be formed of a monomer material or an organic polymer material. The intermediate layer 125 can not only include the emission layer, but also selectively include function layers, such as a hole transport layer (HTL), a hole injection layer (HIL), an electron transport layer (ETL), and an electron injection layer (EIL).

If the counter electrode 123 functions as a cathode, the counter electrode 123 can be formed of a metal, such as Ag, Mg, Al, Pt, Pd, Au, Ni, Nd, Ir, Cr, Li, or Ca. Furthermore, the counter electrode 123 can further include ITO, IZO, ZnO, or $In_2O_3$ for light transmission.

Figure 6:
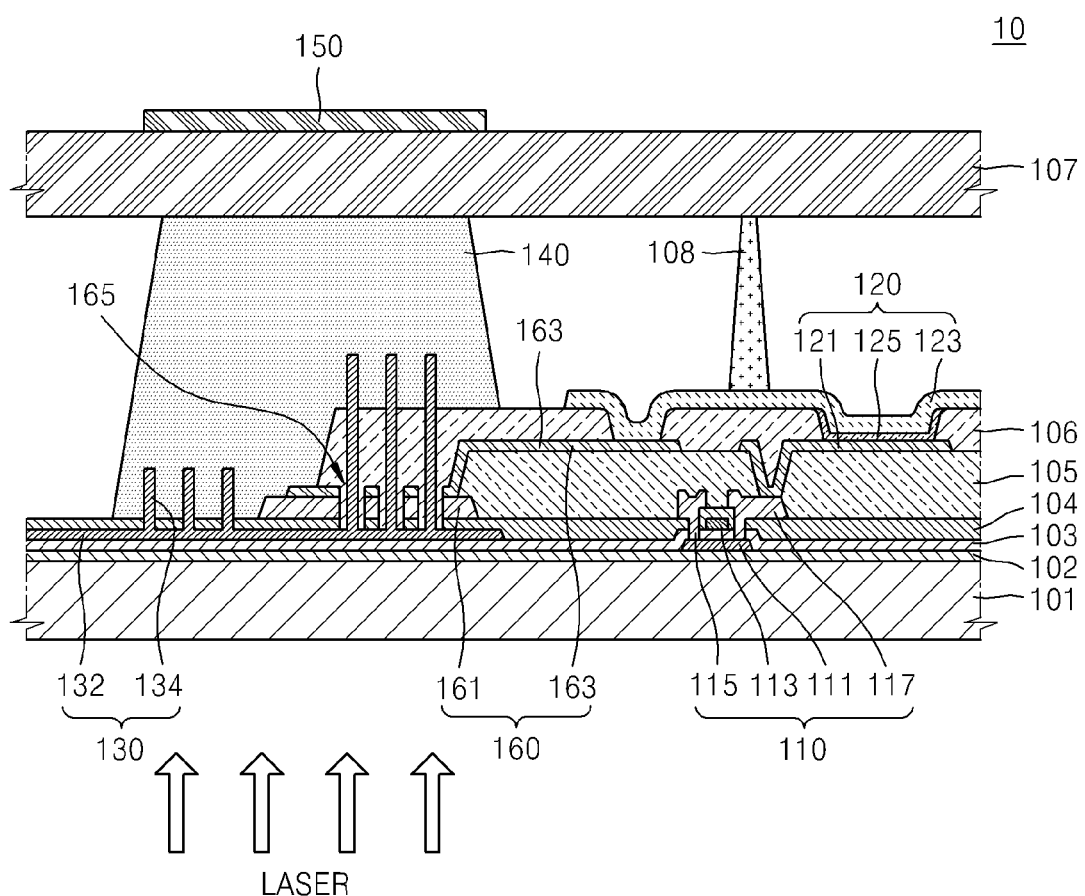
FIG. 6 is a schematic sectional view of radiation fins and a sealing member on an organic light emitting display device according to an exemplary embodiment of the disclosed technology.

Finally, as shown in FIG. 6, the radiation fins 134 are formed in the contact holes (165 of FIG. 5). Then the sealing member 140 is formed between the first substrate 101 and the second substrate 107. Furthermore, the spacer 108 can be further formed between the first substrate 101 and the second substrate 107 to maintain a distance between the first substrate 101 and the second substrate 107.

The radiation fins 134 can be formed of a metal, such as molybdenum (Mo), titanium (Ti), and aluminum (Al), using a method like deposition. The radiation fins 134 can be formed in a vertical direction and can contact the radiation layer 132 which is formed to horizontally extend toward edges of the first substrate 101. The radiation fins 134 can be formed to be higher than the pixel defining layer 106 or the interlayer insulation layer 104 and inserted into the sealing member 140.

The sealing member 140 is formed to include the radiation fins 134. Furthermore, the sealing member 140 can be formed to partially overlap the wiring unit 160, thereby reducing dead space. In some exemplary implementations, the sealing member 140 canis formed by applying a thermal hardening resin between edges of the first substrate 101 and edges of the second substrate 107 and by hardening the resin by irradiating a laser beam in a direction from the first substrate 101 toward the second substrate 107.

Meanwhile, the touch panel wiring unit 150 can be arranged at a location on the second substrate 107 to overlap the sealing member 140, it is necessary to increase power of a laser beam to irradiate for a temperature profile of the sealing member 140 to become uniform. Here, even if temperature of the sealing member 140 increases due to irradiation of a laser beam, the radiation fins 134 is formed in the sealing member 140 to directly contact the sealing member 140, heat inside the sealing member 140 can be effectively transmitted to the radiation layer 132. Therefore, a high power laser beam can be irradiated to the sealing member 140 without damaging a circuit unit (PI of FIG. 1).

As described above, according to the one or more of the above embodiments of the disclosed technology, dead space can be reduced. Furthermore, a sealing member can be formed by using a high power laser beam without damaging a circuit unit.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the disclosed technology have been described with reference to the figures, it will be understood by those of ordinary skill in the art that various changes in form and details can be made therein without departing from the spirit and scope of the disclosed technology as defined by the following claims.

What is claimed is:

1. An organic light emitting display device comprising:
    a first substrate and a second substrate facing each other;
    a pixel portion formed on the first substrate and comprising an organic light emitting device and a thin-film transistor (TFT);
    a circuit portion formed on the first substrate and outside the pixel portion;
    a sealing member configured to partially overlap the circuit portion and adhere the first substrate and the second substrate to each other; and
    a radiation portion further including:
        a plurality of radiation fins formed in the sealing member, and
        a radiation layer formed to contact first ends of the radiation fins.

2. The organic light emitting display device of claim 1, wherein the radiation layer extends toward edges of the first substrate, and wherein the radiation fins are formed to be in a direction vertical to the top surface of the radiation layer.

3. The organic light emitting display device of claim 1, wherein the first ends of the radiation fins extend toward the first substrate, and
    wherein the radiation layer extends to outside of the first substrate.

4. The organic light emitting display device of claim 3, wherein the radiation fins have a pillar-like shape and are apart from one another.

5. The organic light emitting display device of claim 3, wherein a touch panel wiring portion is arranged on a surface of the second substrate opposite to the surface of the second substrate contacted by the sealing member, and
    wherein the touch panel wiring portion is formed at a location overlapping the sealing member.

6. The organic light emitting display device of claim 3, wherein the TFT comprises:
    an active layer;
    a gate electrode formed on the active layer via a gate insulation layer; and
    a source electrode and a drain electrode, which penetrate through the gate insulation layer and an interlayer insulation layer and contact the active layer, the interlayer insulation layer formed on the gate insulation layer, and
    the radiation layer is formed on the gate insulation layer and is formed of a same material as the gate electrode.

7. The organic light emitting display device of claim 6, wherein the interlayer insulation layer is formed on the radiation layer, and
    wherein the radiation fins penetrate through the interlayer insulation layer and contact the radiation layer.

8. The organic light emitting display device of claim 7, wherein a wiring portion is formed on the interlayer insulation layer in the pixel portion and comprises holes via which some of the radiation fins extend.

9. The organic light emitting display device of claim 8, wherein insulation layers are formed on inner side surfaces of the holes.

10. The organic light emitting display device of claim 9, further comprising a pixel defining layer, wherein the organic light emitting device comprises a pixel electrode contacting the drain electrode, a counter electrode arranged on the pixel electrode, and an intermediate layer interposed between the pixel electrode and the counter electrode,
    wherein the pixel defining layer defines a region for forming the intermediate layer and is formed on the pixel electrode, and
    wherein the insulation layers are formed of the same material as the pixel defining layer.

11. The organic light emitting display device of claim 10, wherein the radiation fins are higher than the pixel definition layer and are formed to be inserted into the sealing member.

12. The organic light emitting display device of claim 10, wherein the some of the radiation fins penetrate through the pixel defining layer overlapping the sealing member.

13. The organic light emitting display device of claim 10, wherein the pixel defining layer comprises contact holes that expose the top surface of the radiation layer by applying the insulation layers in the holes and on the pixel electrode and by patterning the insulation layers.

14. The organic light emitting display device of claim 13, wherein the contact holes are smaller than the holes.

15. A method of manufacturing an organic light emitting display device, the method comprising:
    forming an active layer and a gate insulation layer, the gate insulation layer covering the active layer on a first substrate;
    forming a radiation layer and a gate electrode on the gate insulation layer and an interlayer insulation layer, the interlayer insulation layer covering the radiation layer and the gate electrode;
    forming a first wiring portion, a source electrode and a drain electrode on the interlayer insulation layer and forming a passivation layer covering the source electrode and the drain electrode, the drain electrode contacting the active layer;
    forming a second wiring portion and a pixel electrode, the second wiring portion contacting the first wiring portion, and the pixel electrode contacting the drain electrode;

forming holes exposing the top surface of the radiation layer by patterning the first wiring portion and the second wiring portion;

forming a pixel defining layer comprising contact holes for exposing the top surface of the radiation layer by applying insulation layers in the holes and on the pixel electrode and patterning the insulation layers;

forming radiation fins in the contact holes; and adhering the first substrate and a second substrate to each other by forming a sealing member to include the radiation fins.

16. The method of claim 15, wherein a touch panel wiring portion is formed on the second substrate at a location overlapping the sealing member.

17. The method of claim 15, wherein the insulation layers fill the holes, and the contact holes are formed by patterning the insulation layers filling the holes.

18. The method of claim 17, wherein the contact holes are smaller than the holes.

19. The method of claim 17, wherein the radiation fins are formed to be higher than the pixel defining layer and inserted into the sealing member.

20. The method of claim 17, wherein forming the radiation fins comprises forming the radiation fins in a direction vertical to the radiation layer, and wherein forming the radiation layer comprises extending the radiation layer toward edges of the first substrate.

* * * * *